United States Patent [19]
Lee et al.

[11] Patent Number: 5,746,462
[45] Date of Patent: May 5, 1998

[54] FLEXIBLE VACUUM PICK-UP DEVICE

[75] Inventors: C. H. Lee, Chang-hua; Y. H. Chen, Hsin-Chu, both of Taiwan

[73] Assignee: Taiwan Semiconductor Manufacturing Company,Ltd., Hsin-Chu, Taiwan

[21] Appl. No.: 764,327

[22] Filed: Dec. 12, 1996

[51] Int. Cl.⁶ .................................................... B25J 15/06
[52] U.S. Cl. ............................................ 294/64.1; 29/743
[58] Field of Search ............................ 294/64.1–64.3, 294/19.1; 29/743, 758; 414/935, 939, 941

[56] References Cited

U.S. PATENT DOCUMENTS

| | | | |
|---|---|---|---|
| 2,922,873 | 1/1960 | Bibbero et al. | 294/64.1 |
| 2,983,541 | 5/1961 | Maki | 294/64.1 |
| 4,767,142 | 8/1988 | Takahashi et al. | 294/64.1 |
| 5,203,241 | 4/1993 | Mattis | 294/118 |
| 5,290,082 | 3/1994 | Palmer et al. | 29/743 |

FOREIGN PATENT DOCUMENTS 3-66578   3/1991   Japan ............................ 294/64.1

OTHER PUBLICATIONS

Western Electric Technical Digest No. 27, Jul. 1972.

*Primary Examiner*—Dean Kramer
*Attorney, Agent, or Firm*—Barnes, Kisselle, Raisch,Choate, Whittemore & Hulbert, P.C.

[57] ABSTRACT

The present invention discloses a flexible vacuum pick-up device for use in wafer processing that includes a handle portion adapted for holding by a human hand, the handle portion has a passage therein for fluid communication, a flexible conduit for providing a connection between the handle portion and a pick-up head and for providing a vacuum passage therethrough, and a vacuum pick-up head that has an extended planar surface adapted for making intimate contact with a substantially flat wafer.

11 Claims, 1 Drawing Sheet

FLEXIBLE VACUUM PICK-UP DEVICE

FIELD OF THE INVENTION

The present invention generally relates to a semiconductor processing equipment and more particularly, relates to a flexible vacuum pick-up device for wafers that can be shaped in any contour such that a wafer can be picked up or layed down at any specific angle.

BACKGROUND OF THE INVENTION

In the fabrication of semiconductor devices, wafers of semiconducting nature such as those of silicon wafers must be processed through a multiplicity of fabrication steps which can amount to several hundred steps for a complicated IC device. For instance, a wafer is normally sent through a variety of fabrication processes which possibly include oxidation, dielectric layer deposition, stress relief and annealing, ion implantation, planarization and chemical-mechanical-polishing, etc.. In each of these processing steps, the wafers are sometimes processed in batches by loading them into a wafer boat which can hold up to 24 wafers and then processing them in a horizontal or a vertical processing chamber. The wafers can also be processed in fabrication chambers that process only one wafer at a time. In either case, the wafer must be picked up by a suitable tool for loading into either a wafer boat or a processing chamber.

Wafer pick-up tools of various configurations have been designed and utilized for picking up wafers in a semiconductor fabrication plant. Since wafers are processed in a clean room environment and cannot tolerate the presence of any contaminants, a wafer pick-up tool must be designed to satisfy this important requirement. It is known that most mechanical pick-up devices, e.g., a clamp, would generate contaminants due to its mechanical contact with a wafer surface, a pick-up device utilizing vacuum is more desirable. Most commercially available vacuum pick-up devices consist of a handle and a fixed-position pick-up head. This creates a problem in various applications where the loading of a wafer must be performed in an awkward position due to a limited access to the processing chamber or a limited access to a wafer stage where the wafer must be placed. A fixed-head vacuum pick-up device can only be used to position a wafer at a certain distance from the surface of the stage and sometimes, the wafer must be dropped by releasing vacuum. This creates great problems in that breaking or cracking of the wafer can occur which results in the scrap of the wafer and furthermore, particle contamination can be easily produced by such mechanical impact.

It is therefore an object of the present invention to provide a vacuum pick-up device for use in semiconductor fabrication that does not have the drawbacks or shortcomings of conventional vacuum pick-up devices.

It is another object of the present invention to provide a vacuum pick-up device for use in semiconductor processing that does not have a vacuum head mounted in a fixed position.

It is a further object of the present invention to provide a vacuum pick-up device for semiconductor processing wherein the pick-up head can be positioned independently of the pick-up handle.

It is still another object of the present invention to provide a vacuum pick-up device for semiconductor processing wherein the pick-up head can be shaped into any contour or angle.

It is yet another object of the present invention to provide a vacuum pick-up device for use in semiconductor processing wherein a flexible conduit is used in connecting a pick-up head with a pick-up handle.

It is another further object of the present invention to provide a vacuum pick-up device for use in semiconductor processing wherein a shapeable and flexible conduit is used in between a pick-up head and a pick-up handle such that specific positions of the pick-up head can be formed and retained.

It is still another further object of the present invention to provide a vacuum pick-up device for use in semiconductor processing wherein a vacuum shut-off switch is mounted in the pick-up handle so that vacuum can be readily turned on or turned off.

SUMMARY OF THE INVENTION

In accordance with the present invention, a vacuum pick-up device for use in semiconductor processing is provided which can be shaped to any specific contour desired and then retaining such contour.

In a preferred embodiment, a flexible vacuum pick-up device for use in wafer processing is provided which includes a handle portion adapted for holding by a human hand, the handle portion contains a passage therethrough for fluid communication, a shapeable flexible conduit which has a first end and a second end, the first end is adapted for connecting to one end of the handle portion and the second end is adapted for connecting to a pick-up head, and a pick-up head which has a fluid outlet for connecting to the second end of the conduit and a generally laterally extended thereon surface having at least one aperture there adapted for intimate contact with a substantially flat wafer surface and for fluid communication with the passage in the handle portion such that vacuum can be applied to the wafer surface.

The present invention is also directed to a flexible vacuum pick-up device which includes a handle that has a vacuum passage therein, a flexible conduit for providing a connection between the handle and a pick-up head and for providing a vacuum passage therethrough, and a vacuum pick-up head which has an extended planar surface adapted for making intimate contact with an object to be picked up.

The present invention is further directed to a method of transporting wafers by a vacuum pick-up device which can be carried out by first providing a handle that has a connecting means at one end for connecting to a vacuum source and a flexible conduit at the other end for establishing a fluid communication with the vacuum source, then connecting a pick-up head to a free end of the flexible conduit, the pick-up head is equipped with a generally laterally extending surface capable of making intimate contact with and providing vacuum to a wafer, then providing a negative pressure from the vacuum source, and contacting the pick-up head with a wafer.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention provides a flexible vacuum pick-up device for use in wafer processing that includes a pick-up head, a shapeable flexible conduit, a pick-up handle and a vacuum source. The flexible conduit can be shaped in any contour and then retains such contour so that the pick-up head can be positioned at any angle in relation to the pick-up handle to facilitate the positioning and the removal of wafers from areas having limited access.

Figure 1:
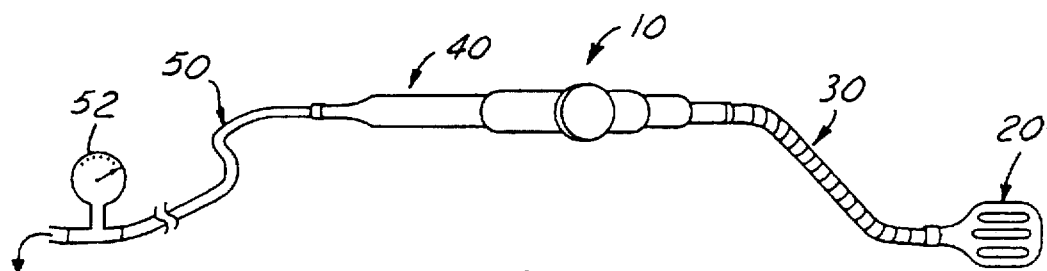
FIG. 1 is a perspective view of the present invention vacuum pick-up device which includes a pick-up head, a flexible conduit, a pick-up handle and a vacuum source.

Referring initially to FIG. 1, wherein a present invention pick-up device 10 is shown. The vacuum pick-up device 10 is constructed of a pick-up head 20, a flexible conduit 30, a pick-up handle 40 and a vacuum line 50. The various components can be connected together to provide a vacuum passage therethrough by any one of known mechanical methods such as screw threads, quick disconnects, or permanently connected together by welding.

Figure 2:
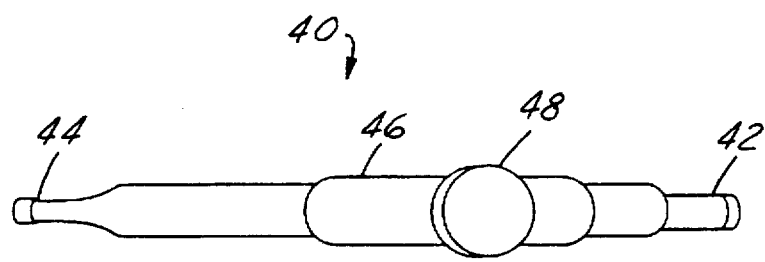
FIG. 2 is an enlarged plane view of the pick-up handle shown in FIG. 1.

FIG. 2 is an enlarged, plane view of the pick-up handle 40 shown in FIG. 1. The pick-up handle 40 is designed to be held conveniently by a human hand which consists of a body portion 46, an inlet 42, an outlet 44 and optionally, a shut-off switch 48. The body portion 46 of the pick-up handle 40 can be molded of a plastic material or constructed of a metallic material with a hollow vacuum passage contained therein. The inlet 42 is generally connected to the flexible conduit 30 for providing a vacuum to the pick-up head 20. The outlet 44 of the pick-up handle 40 is provided for connection with the vacuum line 50 by any one of known mechanical means. The body portion 46 of the handle 40 may optionally contain a shut-off switch 48 which can be thumb operated, for instance, by pressing down to allow vacuum in the pick-up head or by releasing to cut off vacuum. The built-in shut-off switch 48 may not be necessary if other shut-off means is provided for the vacuum pick-up device. For instance, a foot pedal operated shut-off device may optionally be used to connect or shut-off a vacuum source to the pick-up head 20. Other shut-off devices may also be suitably used in the present invention vacuum pick-up device 10.

Figure 3:
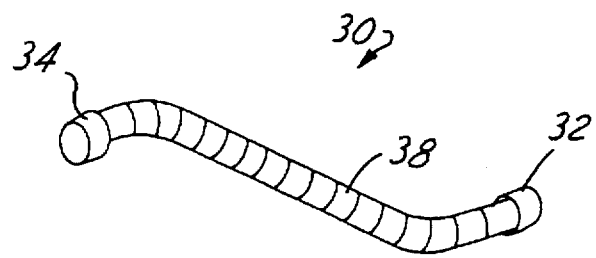
FIG. 3 is an enlarged perspective view of the flexible conduit shown in FIG. 1.

Referring now to FIG. 3, where an enlarged view of the flexible conduit 30 is shown. The flexible conduit 30 enables the present invention novel feature of the various positioning of the pick-up head 20 in relation to the pick-up handle 40. One other advantage made possible by the present invention pick-up device is that the flexible conduit 30 not only can be shaped, but also can retain such shape.

The flexible conduit 30 is equipped with an inlet 32, an outlet 34 and a conduit body 38. The conduit body 38 can be suitably constructed of a helical metal tape such as that commonly known as a snake or a goose-neck construction so that it can be bent into any shape or angle and then made to retain such shape or angle. Other suitable materials can also be used for the construction of the conduit body 38 such as a plastic material that is capable of being shaped and then retaining its shape. The inlet 32 of the flexible conduit 30 is used for connection to the pick-up head 20 by any one of suitable mechanical fastening means. For instance, inlet 32 may be provided with male threads on the outer surface for engaging a female thread in the pick-up head 20. The inlet 32 may also be permanently affixed to the pick-up head 20 by compression fitting means or by welding when the inlet and the pick-up head are both constructed of a metallic material.

The outlet 34 of the flexible conduit 30 is used for connection to the inlet 42 of the pick-up handle 40. Any one of the common mechanical connection means can be suitably used. It would be desirable that a removable connection be used in between the outlet 34 and the inlet 42 such that different flexible conduit can be used in different applications. For instance, for applications wherein a longer reach is required for placing a wafer into a large processing chamber, a longer flexible conduit 30 can be used to replace a regular length flexible conduit. Similarly, a shorter flexible conduit may be utilized when the reach required of the pick-up device is short.

Figure 4A:
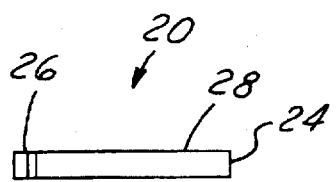
FIG. 4A is a side view of the pick-up head shown in FIG. 4.
Figure 4B:
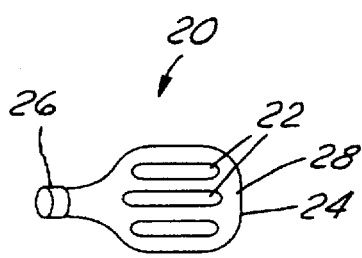
FIG. 4B is an enlarged plane view of the pick-up head shown in FIG. 1.

An enlarged planar view of the pick-up head 20 is shown in FIG. 4. The pick-up head 20 is constructed of a body portion 24 which has a generally laterally extended planar surface 28 and at least one elongated slot opening 22 in the surface. The pick-up head 20 is constructed of a hollow construction with a vacuum inlet 26 provided at one end of the body 24. The hollow nature of the pick-up head 20 can be easily seen in an enlarged cross-sectional view of the pick-up head 20 shown in FIG. 4A. The vacuum slot openings 22 need not be in an elongated shape such as that shown in FIG. 4, instead, they can be provided as apertures or a series of apertures in the surface of the pick-up head.

The generally laterally extended planar surface 28 is designed such that it provides an intimate contact with a substantially flat wafer surface. In place of a generally laterally extended planar surface, any other surface configuration can also be used as long as a secure contact with a wafer surface can be maintained. For instance, the surface 28 may contain a series of protruding bars or points through which vacuum can be provided through apertures. The vacuum inlet 26 is designed such that a mechanical connection with the inlet 32 of the flexible conduit 30 can be easily made. It is desirable to employ a removable mechanical connection between inlet 26 of the pick-up head 20 and inlet 32 of the flexible conduit 30 such that a conduit of different length or size can be used by disconnecting the pick-up head from the conduit. The pick-up head 20 can be manufactured of any suitable material, for instance, of metal or a molded plastic material. One important requirement is that the construction of the pick-up head 20 must be such that it does not release contaminants during usage, i.e., it does not release particles from a molded plastic material or from a metal construction.

FIG. 1 also shows a vacuum line 50 which can be constructed of a known material such as a reinforced rubber hose that is non-collapsible. A vacuum gage 52 can be conveniently connected in line to indicate the vacuum pressure. A suitable vacuum pressure is that normally found in a semiconductor fabrication plant, i.e., in the range between about 20 psi and about 60 psi.

It should be noted that while FIG. 1 illustrates a general construction of the present invention vacuum pick-up device, the novel features of the present invention pick-up device can be achieved in other constructions as well. For instance, any other suitably configured pick-up handle 40 can be used as long as it is shaped for easy grip by a human hand and further, it is equipped with connection means that allows an easy interchange of the flexible conduit and the vacuum lines. Furthermore, the vacuum pick-up head 20 can also be configured in any other configurations as long as a firm contact can be made with a substantially flat wafer surface. The flexible conduit 30 should be constructed of a material and in such a configuration that it can be bent into any shape or contour and retaining such shape and contour.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A flexible vacuum pick-up device for use in semiconductor wafer processing comprising:

a handle portion adapted for holding by a human hand, said handle portion containing a passage therein for fluid communication, a shapeable flexible conduit for providing a vacuum passage therethrough constructed of a helical metal tape having a first end and a second end, said first end is adapted for connecting to one end of said handle portion and said second end is adapted for connecting to a pick-up, and a pick-up head having a fluid outlet for connecting to said second end of said conduit and a generally laterally extended surface having at least one aperture therein adapted for intimate contact with a substantially flat wafer surface and for fluid communication with the passage in the handle portion such that vacuum may be applied to the wafer surface.

2. A device according to claim 1, wherein the end of the handle portion not connected to the conduit is connected to and in fluid communication with a vacuum source.

3. A device according to claim 2, wherein said vacuum source presents a negative pressure of at least 20 psi.

4. A device according to claim 1, wherein said handle portion further comprises a valve means for opening and closing said passage for fluid communication.

5. A device according to claim 1, wherein said shapeable flexible conduit can be bent into any desirable shape.

6. A device according to claim 1, wherein said pick-up head is constructed of a plastic material.

7. A device according to claim 1, wherein said pick-up head is equipped with a plurality of elongated openings in its generally laterally extended surface.

8. A method of transporting wafers by a vacuum pick-up device comprising the steps of:

providing a handle having a connection means at one end for connecting to a vacuum source and a shapeable flexible conduit constructed of a helical metal tape at the other end for establishing fluid communication with said vacuum source, connecting a pick-up head to a free end of said flexible conduit, said pick-up head is equipped with a generally laterally extending surface capable of making intimate contact with and providing vacuum to a wafer, providing a negative pressure from said vacuum source, and contacting said pick-up head with said wafer.

9. A method according to claim 8, wherein said flexible conduit can be shaped to substantially any configuration such that a wafer can be picked up at substantially any angle.

10. A method according to claim 8 further comprising the step of providing a vacuum source having a negative pressure of about 60 psi.

11. A method according to claim 8, wherein said handle further comprises a valve means for connecting/disconnecting to said vacuum source.

* * * * *